(12) United States Patent
McGeoch

(10) Patent No.: US 7,637,403 B2
(45) Date of Patent: Dec. 29, 2009

(54) LIQUID METAL DROPLET GENERATOR

(75) Inventor: Malcolm W. McGeoch, Brookline, MA (US)

(73) Assignee: Plex LLC, Fall River, MA (US)

( * ) Notice: Subject to any disclaimer, the term of this patent is extended or adjusted under 35 U.S.C. 154(b) by 365 days.

(21) Appl. No.: 11/257,926

(22) Filed: Oct. 25, 2005

(65) Prior Publication Data

US 2006/0102663 A1 May 18, 2006

Related U.S. Application Data

(60) Provisional application No. 60/621,895, filed on Oct. 25, 2004.

(51) Int. Cl.
| | | |
|---|---|---|
| *B22D 41/00* | (2006.01) | |
| *B22D 35/06* | (2006.01) | |
| *B22D 41/05* | (2006.01) | |
| *B22D 41/015* | (2006.01) | |
| *B22D 41/08* | (2006.01) | |
| *B67D 5/62* | (2006.01) | |
| *B67D 5/37* | (2006.01) | |
| *B67D 5/54* | (2006.01) | |
| *C21B 7/12* | (2006.01) | |
| *C21C 5/42* | (2006.01) | |
| *B22D 11/00* | (2006.01) | |

(52) U.S. Cl. .................. 222/591; 222/593; 222/594; 266/236; 164/271

(58) Field of Classification Search .............. 222/591, 222/593, 594; 164/271; 266/236; 347/54, 347/55
See application file for complete search history.

(56) References Cited

U.S. PATENT DOCUMENTS

| | | | |
|---|---|---|---|
| 4,057,807 A | | 11/1977 | Fishbeck et al. |
| 5,229,016 A | | 7/1993 | Hayes et al. |
| 5,415,679 A | | 5/1995 | Wallace |
| 5,560,543 A | * | 10/1996 | Smith et al. ............... 239/102.2 |
| 5,876,615 A | * | 3/1999 | Predetechensky ........... 222/590 |
| 6,202,734 B1 | * | 3/2001 | Sackinger et al. ........... 164/271 |
| 7,075,096 B2 | | 7/2006 | McGeoch |

OTHER PUBLICATIONS

Crowell, Benjamin, Simple Nature, Chapter 11-Electromagnetism, 2001, Light and Matter, 645-647.*
McGeoch, Malcolm W., "Plasma pinch EUV source with particle injection", Proc. SPIE, vol. 5751, p. 556 et seq., 2005.

* cited by examiner

*Primary Examiner*—Roy King
*Assistant Examiner*—Caitlin Fogarty
(74) *Attorney, Agent, or Firm*—Wolf, Greenfield & Sacks, P.C.

(57) ABSTRACT

Small, high velocity liquid metal droplets are produced for applications that require the accurate and remote placement of small quantities of a metal. The magnetic pressure of current flowing through liquid metal is used to force small quantities of liquid metal through an orifice. Examples of applications are to feed metal fuel into plasma extreme ultraviolet sources, and to place solder bumps on an integrated circuit prior to the attachment of connections.

11 Claims, 2 Drawing Sheets ized by a pulsed electromagnetic field, as disclosed in U.S. Pat. No. 4,057,807, issued Nov. 8, 1977 to Fishbeck et al. The pressure of the field moves the membrane which in turn pushes the liquid through the nozzle generating droplets. Because of the mass of the membrane and its size, the pressure available via this method is not as great as would be desired, especially for the generation of the very small, high velocity droplets required in an EUV source.

LIQUID METAL DROPLET GENERATOR

CROSS REFERENCE TO RELATED APPLICATION

This application claims priority based on provisional application Ser. No. 60/621,895 filed Oct. 25, 2004, which is hereby incorporated by reference in its entirety.

FIELD OF THE INVENTION

This invention relates to the production of small, high velocity liquid metal droplets for use in applications that require the accurate and remote placement of small quantities of a metal. The magnetic pressure of current flowing through liquid metal is used to force small quantities of liquid metal through an orifice. Examples of applications are to feed metal fuel into plasma extreme ultraviolet sources, and to place solder bumps on an integrated circuit prior to the attachment of connections.

BACKGROUND OF THE INVENTION

There are several applications which require the accurate and remote placement of small quantities of liquid metal. One of these is in the application of solder "bumps" to the terminals of integrated circuits where pure tin is of interest because it is more environmentally friendly than lower temperature solder alloys which contain lead, cadmium or other toxic metals. See, for example, U.S. Pat. No. 5,229,016, issued Jul. 20, 1993 to Hayes et al., and U.S. Pat. No. 5,415,679, issued May 16, 1995 to Wallace et al. Another requirement is in the generation of extreme ultraviolet (EUV) radiation for use in lithography where a small droplet of tin has to be positioned at the focus of a laser beam, or in the center of a small pinch discharge, as disclosed in U.S. application Ser. No. 10/911,334, filed Aug. 4, 2004 and entitled "Injection Pinch Discharge Extreme Ultraviolet Source". Tin is chosen because its ionized states emit strongly at 13.5 nm, the wavelength of choice for EUV lithography. Both of these applications require tin droplets in the range of 10 µm-100 µm in diameter. The droplets should have relatively high velocity, so that high repetition rate processes can be performed. The positional accuracy typically has to be better than 10% of a droplet diameter at several centimeters from the point of launch. Such a degree of precision is necessary for laser-produced plasma EUV sources, in which the focused laser beam must be intercepted by a tin droplet. A lesser degree of precision is required for the injection pinch EUV source, in which the tin has to be positioned within a pinch discharge that may be much larger than the tin droplet.

Prior art methods of liquid drop generation often use the contraction of a piezoelectric or electrostrictive tube in response to an applied electric field. The liquid is contained within the tube and there is a small orifice at one end. The electric field causes contraction of the tube material and forces a small quantity of liquid through the orifice. In the case of liquid metals the operating temperature is often above the Curie temperature at which the piezoelectric effect loses its strength. The use of an electrostrictive transducer has been proposed in order to allow long duration operation at elevated temperature. However, there appear to be limits to the velocity with which the droplets may be ejected, and to the ultimate temperature range accessible by these techniques.

In an approach that avoids the use of temperature-dependent transducer materials a pressure impulse is applied to liquid inside a nozzle via a barrier membrane, the outer side of which is pressurized by a pulsed electromagnetic field, as disclosed in U.S. Pat. No. 4,057,807, issued Nov. 8, 1977 to Fishbeck et al. The pressure of the field moves the membrane which in turn pushes the liquid through the nozzle generating droplets. Because of the mass of the membrane and its size, the pressure available via this method is not as great as would be desired, especially for the generation of the very small, high velocity droplets required in an EUV source.

Accordingly, a new principle of liquid metal droplet generation is needed that circumvents one or more of the above difficulties.

SUMMARY OF THE INVENTION

According to a first aspect of the invention, a liquid metal droplet generator is provided. Liquid metal is forced through an orifice by the force imposed on the metal due to the interaction of a current flowing through the metal with the magnetic field associated with that current.

According to a second aspect of the invention, a liquid metal droplet generator is provided. A static pressurization forces a continuous stream of liquid metal through an orifice, with stream breakup into droplets regulated by repetitive pressure impulses due to the self-magnetic force of repetitive current impulses applied through the liquid metal upstream of the orifice.

According to a third aspect of the invention, a liquid metal droplet generator comprises an insulating tube; a nozzle at one end of the insulating tube; a liquid metal source to supply a liquid metal to the insulating tube; and a pulsed electrical source coupled to the liquid metal in the insulating tube.

BRIEF DESCRIPTION OF THE DRAWINGS

For a better understanding of the present invention, reference is made to the accompanying drawings which are incorporated herein by reference and in which.

DETAILED DESCRIPTION

In a droplet generator the principle of magnetic compression is used to force liquid metal through a small nozzle, or orifice. However, no barrier membrane is required, as the magnetic field due to an electric current within the liquid metal itself acts on this current to generate internal pressure. This effect is referred to as a "pinch" when applied to the passage of current through a plasma, but in this case the inward pinch force is generated by conduction electrons within the liquid metal. The pinch force produces peak pressure on the axis of the liquid metal conductor, where an orifice is located in order to eject liquid metal droplets. The invention therefore only applies to the generation of droplets out of liquids with high electrical conductivity, implying liquid metals.

Figure 1A:
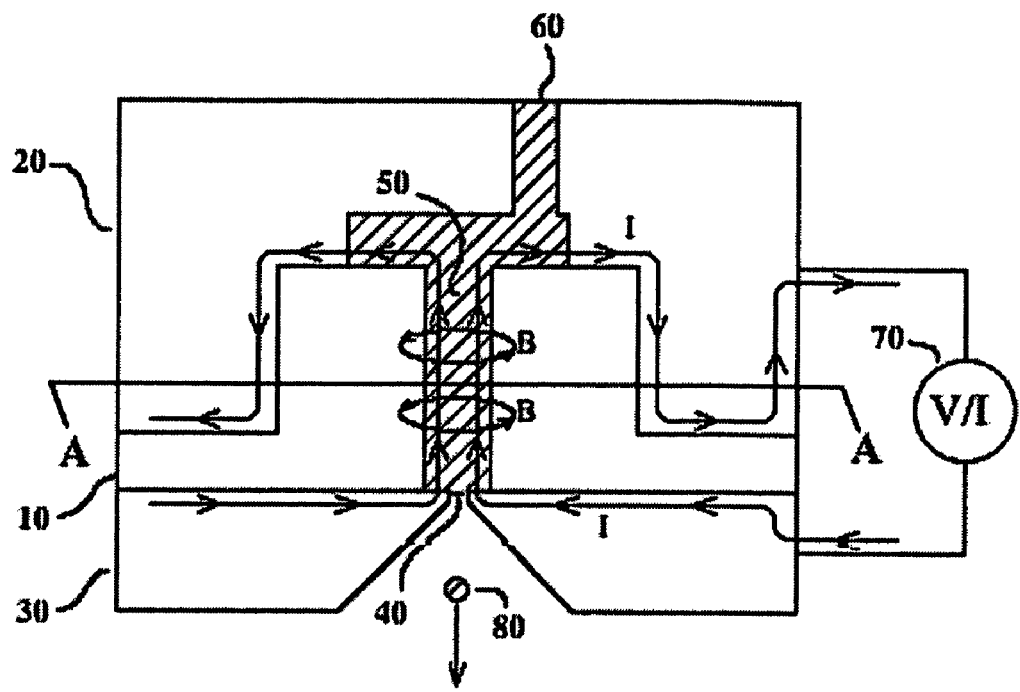
FIG. 1A shows a schematic vertical section of an embodiment of the droplet generator.
Figure 1B:
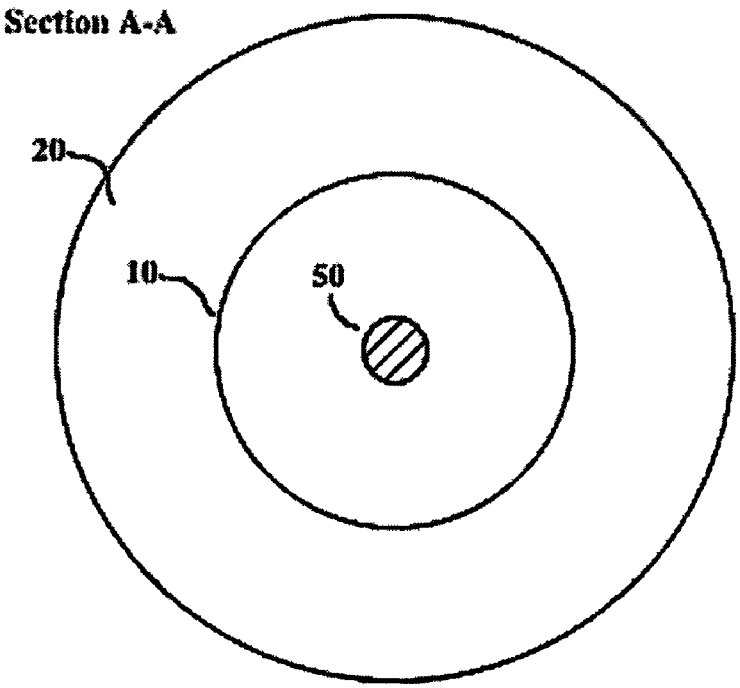
FIG. 1B shows cross section A-A of the droplet generator as called out in FIG. 1A.

One embodiment of the invention is illustrated with reference to FIGS. 1A and 1B. The temperature of the apparatus is raised to the point where the subject metal is liquid. The liquid metal 50 fills a small cylindrical hole through the center of an insulator disc 10 to define a cylindrical volume of liquid metal. At one end of this cylindrical metal volume is a nozzle, or orifice 40, through which metal is to be forced. In this embodiment, the orifice 40 is within a nozzle body 30 which is made of electrically conductive material, solid at the temperature of operation. At the other end of the cylindrical metal volume, the liquid metal fills a disc-shaped volume that is connected with a liquid metal supply reservoir via a passage 60. An electrical circuit through the liquid metal is completed via a cylindrical solid metal conductor 20 that surrounds insulator disc 10 and is contacted to an electrical pulse generator 70. Pulse generator 70 also contacts nozzle body 30, completing the electrical circuit through the liquid metal 50. Current is driven around this circuit either by means of pulse generator 70 included in series within the circuit, as in FIG. 1, or by induction, such as in the case where the circuit is the single turn secondary of a transformer. As shown in FIG. 1A, electrical current I flows through the liquid metal 50 in a direction parallel to a direction of liquid metal flow through the cylindrical hole in insulator disc 10 and parallel to a direction of droplet 80 generation.

With reference to FIG. 1A, when a pulse of current I is induced in the circuit, there is a magnetic field B associated with the current that that has field lines running azimuthally around the cylindrical volume of liquid metal 50. For a current of strength I through the liquid metal 50, the induced magnetic field B at the surface of the cylinder is given by:

$$B = \frac{\mu_0 I}{2\pi r}$$

in which $\mu_0 = 4\pi \times 10^{-7}$ is the permittivity of free space and r is the radius of the cylindrical volume.

Considering either a pure surface distribution, or a uniform volume distribution of the current density J within the cylinder and integrating the J×B force on each radial layer yields an axial pressure $$P = \frac{\mu_0 I^2}{4\pi^2 r^2}$$

where I is in Amperes, r in metres and P in Pascals.

Once the pressure has been established on the axis of the cylindrical volume, liquid metal is forced through orifice 40, forming one or more high velocity droplets 80. The diameter of a droplet so formed is roughly proportional to the diameter of the orifice. The velocity of a droplet is related to the magnitude and duration of the pressure impulse, the liquid properties of viscosity, density and surface tension, and the diameter, shape and length of the nozzle. The pressure impulse itself depends on the square of the applied current.

As an example of the operation of this embodiment, liquid tin was maintained at 270° C., somewhat above its melting point of 232° C., in a cylindrical volume of radius 0.25 mm (millimeters) and length 4 mm. A pulsed current of duration 3 microseconds and peak current 3 kA (kiloamperes) was passed through the cylindrical volume of liquid tin, generating a transient peak magnetic pressure of $4.6 \times 10^6$ Pa (Pascals). This pressure impulse drove liquid tin through a 40 μm (micrometer) diameter nozzle located at one end of the cylinder, generating approximately 4 droplets of sizes in the range 20 μm to 50 μm in diameter. The first droplet had a diameter of 29 μm and a velocity of 25 meters per second. Its transverse positional accuracy at 42 mm from the nozzle was ±3 μm and its longitudinal positional accuracy at the same location and at a standard reference time was ±5 μm. Droplets could be repetitively generated at 100 Hz, or more. By tuning the drive current, one can obtain single droplets.

Figure 2:
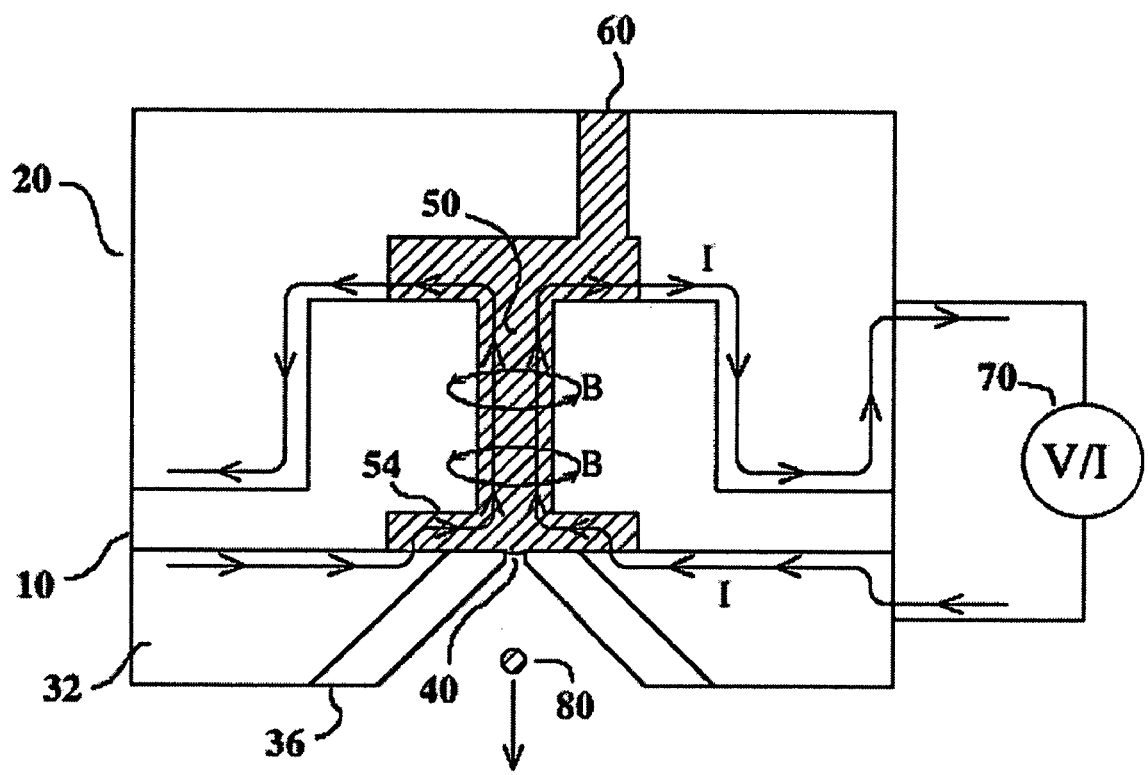
FIG. 2 shows a schematic vertical section of an embodiment of the droplet generator with provision for an insulating nozzle material.

A second embodiment of the invention is shown in FIG. 2 where provision is made for an insulating nozzle material. This widens the choice of materials that do not interact with the liquid metal that is being handled. In FIG. 2 there is an insert 36 of insulating material which comprises the nozzle body. The cylindrical volume of liquid metal 50 is expanded in a shallow cylindrical shape 54 so as to reach the surface of a conducting element 32, and complete the electrical circuit. Operation as a droplet generator is the same as described in relation to FIGS. 1A and 1B.

In another embodiment, a static pressure forces a continuous stream of a liquid metal through an orifice or nozzle. The stream of liquid metal is broken up into droplets in response to repetitive pressure impulses produced by the self-magnetic force of pulsed current impulses applied through the liquid metal upstream of the orifice or nozzle.

Although the invention has been illustrated with reference to specific embodiments, its scope is not limited to these embodiments, but is defined by the following claims:

What is claimed is:

1. A liquid metal droplet generator comprising an insulating tube, an element having an orifice at one end of the insulating tube, a liquid metal reservoir to supply liquid metal to the insulating tube and a pulsed current source coupled to the liquid metal to cause electrical current to flow through the liquid metal in the insulating tube in a direction parallel to a direction of liquid metal flow through the insulating tube and parallel to a direction of droplet generation, wherein the liquid metal is forced through the orifice by the force imposed on the metal due to the interaction of the electrical current flowing through the metal with a magnetic field induced by the electrical current.

2. A liquid metal droplet generator as in claim 1, in which the orifice has an axis of cylindrical symmetry and the liquid metal is contained within a cylindrically symmetric insulating tube with axis parallel to a symmetry axis of the orifice.

3. A liquid metal droplet generator as in claim 1, in which the orifice is defined by a metal of higher melting point than the metal to be ejected.

4. A liquid metal droplet generator as in claim 1, in which the orifice is defined by an insulating material.

5. A liquid metal droplet generator as in claim 3, in which the current is applied to the liquid metal via electrical contact with the metal that defines the orifice.

6. A liquid metal droplet generator as in claim 1, in which the pulsed current is generated via use of a step-down transformer with a single-turn, low-inductance secondary winding that includes within it as a series element the liquid metal or parts thereof.

7. A liquid metal droplet generator comprising an insulating tube, an element having an orifice at one end of the insulating tube, a liquid metal reservoir to supply liquid metal to the insulating tube and a pulsed current source coupled to the liquid metal to cause electrical current to flow though the liquid metal in the insulating tube in a direction parallel to a direction of liquid metal flow through the insulating tube and parallel to a direction of droplet generation, wherein a static pressurization forces a continuous stream of liquid metal through the orifice, with stream breakup into droplets regulated by repetitive pressure impulses due to the self-magnetic force of repetitive electrical current impulses applied through the liquid metal upstream of the orifice.

8. A liquid metal droplet generator comprising:
an insulating tube;

a nozzle at one end of the insulating tube;

a liquid metal source to supply a liquid metal to the insulating tube; and a pulsed electrical source coupled to the liquid metal to cause an electrical current to flow through the liquid metal in the insulating tube in a direction parallel to a direction of liquid metal flow through the insulating tube and parallel to a direction of droplet generation, wherein the liquid metal is forced through the nozzle by the force imposed on the liquid metal due to the interaction of the electrical current flowing through the liquid metal with a magnetic field induced by the electrical current.

9. A liquid metal droplet generator as defined in claim 8, wherein the insulating tube is cylindrical.

10. A liquid metal droplet generator as defined in claim 8, wherein the nozzle is defined by an insulating material.

11. A liquid metal droplet generator as defined in claim 8, wherein the nozzle is defined by a metal of higher melting point than the liquid metal.

\* \* \* \* \*